(12) United States Patent
Trivedi et al.

(10) Patent No.: US 9,099,957 B2
(45) Date of Patent: Aug. 4, 2015

(54) VOLTAGE-CONTROLLED OSCILLATORS AND RELATED SYSTEMS

(75) Inventors: Vishal P. Trivedi, Chandler, AZ (US); Kun-Hin To, Gilbert, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 221 days.

(21) Appl. No.: 13/485,742

(22) Filed: May 31, 2012

(65) Prior Publication Data

US 2012/0235757 A1    Sep. 20, 2012

Related U.S. Application Data

(63) Continuation-in-part of application No. 13/051,611, filed on Mar. 18, 2011.

(51) Int. Cl.
| | |
|---|---|
| *H03B 5/08* | (2006.01) |
| *H03B 5/18* | (2006.01) |
| *H03B 5/12* | (2006.01) |
| *H03B 5/00* | (2006.01) |

(52) U.S. Cl.
CPC ............ *H03B 5/1228* (2013.01); *H03B 5/1215* (2013.01); *H03B 5/1231* (2013.01); *H03B 5/1243* (2013.01); *H03B 5/00* (2013.01); *H03B 5/08* (2013.01); *H03B 5/12* (2013.01); *H03B 5/1206* (2013.01); *H03B 5/1212* (2013.01); *H03B 5/18* (2013.01)

(58) Field of Classification Search
CPC .......... H03B 5/00; H03B 5/12; H03B 5/1212; H03B 5/1206; H03B 5/1228; H03B 5/1243; H03B 5/1231; H03B 5/1215; H03B 5/08; H03B 5/18

USPC .................. 331/117 R, 117 FE, 167, 107 SL
See application file for complete search history.

(56) References Cited

U.S. PATENT DOCUMENTS

| | | | | |
|---|---|---|---|---|
| 5,929,716 | A * | 7/1999 | Komori et al. ................. | 331/135 |
| 6,046,647 | A * | 4/2000 | Nelson .......................... | 331/105 |
| 6,469,586 | B1 * | 10/2002 | Rogers et al. ............. | 331/117 R |

(Continued)

FOREIGN PATENT DOCUMENTS

WO    2010092491 A2    8/2010

OTHER PUBLICATIONS

USPTO "Non-Final Office Action" mailed Oct. 19, 2012; U.S. Appl. No. 13/250,385, filed Sep. 30, 2011.

(Continued)

*Primary Examiner* — Robert Pascal
*Assistant Examiner* — Richard Tan
(74) *Attorney, Agent, or Firm* — Ingrassia Fisher & Lorenz, P.C.

(57) ABSTRACT

Apparatus are provided for voltage-controlled oscillators (VCOs) and related systems. An exemplary VCO includes an active-circuit arrangement employing cross-coupled amplifying elements that facilitate generation of an oscillating signal, plus a resonator arrangement capacitively coupled via resonator terminals to primary terminals of the active-circuit arrangement, to influence an oscillation frequency of the oscillating signal based on a difference between control voltages applied to first and second control terminals of the resonator arrangement. When employing bipolar amplifying elements their control terminals are cross-coupled to the opposing resonator terminals. VCO output may be taken from the primary terminals or from the resonator terminals.

18 Claims, 3 Drawing Sheets

(56) References Cited

U.S. PATENT DOCUMENTS

| | | | |
|---|---|---|---|
| 6,661,301 B2 | 12/2003 | Traub | |
| 6,680,657 B2* | 1/2004 | Wang et al. | 331/177 V |
| 6,806,785 B2 | 10/2004 | Traub | |
| 6,927,643 B2 | 8/2005 | Lazarescu et al. | |
| 7,620,382 B2* | 11/2009 | Yamamoto | 455/343.1 |
| 7,636,020 B1* | 12/2009 | Hwang | 331/16 |
| 7,688,153 B2 | 3/2010 | Jacobsson et al. | |
| 7,737,797 B2 | 6/2010 | Shen | |
| 2002/0113659 A1 | 8/2002 | Scoggins | |
| 2008/0309435 A1 | 12/2008 | Wu | |
| 2009/0167593 A1 | 7/2009 | Storz et al. | |
| 2009/0231051 A1 | 9/2009 | Tokuyama | |
| 2010/0289592 A1* | 11/2010 | Lee et al. | 331/117 R |
| 2011/0102093 A1* | 5/2011 | El Rai et al. | 331/117 FE |
| 2011/0187420 A1 | 8/2011 | Kuo et al. | |
| 2012/0001699 A1 | 1/2012 | Yang et al. | |
| 2012/0169428 A1 | 7/2012 | Maarefi et al. | |

OTHER PUBLICATIONS

USPTO, Final Office Action for U.S. Appl. No. 13/051,611, mailed Feb. 26, 2013.

USPTO, Response to Final Office Action dated Feb. 26, 2013, for U.S. Appl. No. 13/051,611, filed May 17, 2013.

Hegazi, E., et al. "A Filtering Technique to Lower LC Oscillator Phase Noise," IEEE Journal of Solid-State Circuits, vol. 36, No. 12, Dec. 2001. pp. 1921-1930.

Salle, D., et al. "A Fully Integrated 77GHz FMCW Radar Transmitter Using a Fractional-N Frequency Synthesizer," Proceedings of the 6th European Radar Conference, Sep. 30-Oct. 2, 2009. pp. 149-152.

Shanan, H., et al. "A Technique to Reduce Flicker Noise Up-Conversion in CMOS LC Voltage-Controlled Oscillators," 30th European Solid-State Circuits Conference, Sep. 21-23, 2004. pp. 123-126.

J.H.C.Zhan, J.S.Duster, and K.T.Kornegay, "A Comparative Study of MOS VCOs for Low Voltage High Performance Operation," Proc. of 2004 Int. Symp. on Low Power Electronics and Design, pp. 244-247.

Zhan, J.H.C., et al. "A Comparative Study of Common MOS VCO Topologies," downloaded from http://domino.watson.ibm.com/acas/w3www_acas.nsf/images/projects_03.04/$FILE/kornegay.pdf.

USPTO "Non-Final Office Action" mailed Jul. 2, 2012: U.S. Appl. No. 13/051,611, filed Mar. 18, 2011.

USPTO, Non-Final Office Action for U.S. Appl. No. 13/051,611, mailed Feb. 27, 2014.

* cited by examiner

VOLTAGE-CONTROLLED OSCILLATORS AND RELATED SYSTEMS

CROSS-REFERENCES TO RELATED APPLICATIONS

This is a continuation-in-part of application Ser. No. 13/051,611, filed Mar. 18, 2011.

TECHNICAL FIELD

Embodiments of the subject matter described herein relate generally to electronic circuits, and more particularly, embodiments of the subject matter relate to voltage-controlled oscillators and related circuit topologies and systems.

BACKGROUND

Voltage-controlled oscillators (VCOs) are commonly used to produce an oscillating signal that oscillates at a desired frequency in response to an applied voltage (or control voltage). For example, phase-locked loops (PLLs) may utilize a VCO to generate a signal having a particular oscillation frequency. In most systems, the VCO is designed to accommodate a range of possible oscillation frequencies over a predetermined input voltage range. Many VCOs include a number of transistors and/or other semiconductor devices, such as varactors, suitably configured to create an electronic oscillator. However, process, voltage, and temperature (PVT) variations may affect the operating parameters for the components that comprise the VCO, which in turn, affect the range of oscillation frequencies achievable by the VCO over the input voltage range. For example, with conventional cross-coupled VCO topologies that utilize varactors to tune the oscillation frequency, variations in the supply voltage may undesirably vary the capacitance of one or more of the varactors, thereby reducing or otherwise shifting the range of oscillation frequencies that the VCO is capable of oscillating at. As the supply voltage is reduced, the effects of supply voltage variations are exacerbated. Another concern is how different types of amplifying devices can be accommodated.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description. As used herein the abbreviation "AC" stands for "alternating current or voltage" and "DC" stands for "direct current or voltage", meaning that as a practical matter, AC signals but not DC signals may pass between AC coupled elements, and as a practical manner, at least DC signals may pass between DC coupled elements.

Embodiments of the subject matter described herein may be used for voltage-controlled oscillators (VCOs) capable of achieving a relatively wide bandwidth tuning range with relatively low susceptibility to supply voltage variations. As described in greater detail below, a cross-coupled active-circuit arrangement and a resonator arrangement are capacitively coupled in a manner that isolates the resonator arrangement from the supply voltage that biases the amplifying elements of the cross-coupled oscillator arrangement. In this manner, the supply voltage (and low frequency variations in the supply voltage) do not influence the capacitance of the variable capacitance elements (or varactors) of the resonator arrangement, and thus, do not appreciably influence the tuning range and/or resonant frequencies provided by the resonator arrangement. Additionally, transmission lines may be utilized to isolate the active-circuit arrangement and the resonator arrangement from the supply voltage at radio frequency (RF) oscillation frequencies. As a result, any variations in the supply voltage do not appreciably influence the capacitance of the variable capacitance elements.

Figure 1:
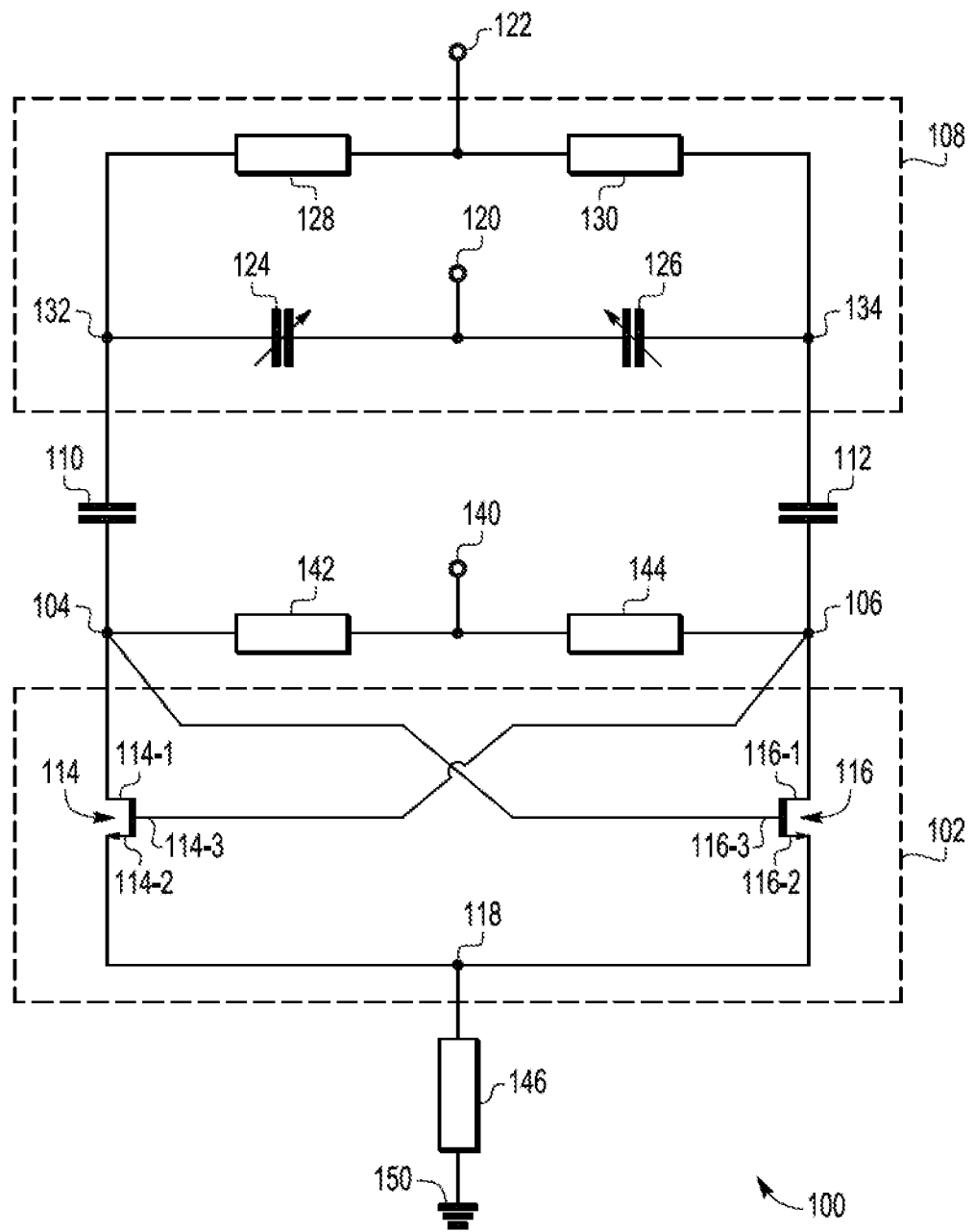
FIG. 1 is a schematic view of a voltage-controlled oscillator module in accordance with one embodiment of the invention.

FIG. 1 depicts an exemplary embodiment of a voltage-controlled oscillator module 100 including, without limitation, an active-circuit arrangement 102 configured to facilitate generation of a pair of oscillating signals at a pair of nodes 104, 106, a resonator arrangement 108, and a pair of capacitive elements 110, 112 coupled between the nodes 104, 106 of the active-circuit arrangement 102 and the resonator arrangement 108. The resonator arrangement 108 is capable of being tuned to a particular resonant frequency from a range of possible resonant frequencies, wherein the oscillation frequency of the oscillating signals at the nodes 104, 106 is governed or otherwise influenced by the tuned resonant frequency provided by the resonator arrangement 108. As used herein, "oscillation frequency," "oscillating frequency," and variants thereof should be understood as referring to the frequency of the oscillating signals at the nodes 104, 106. Furthermore, "corresponding to" and other words of similar import may be used herein to describe the relationship between the oscillation frequency and the tuned resonant frequency, and should not be construed as implying or otherwise requiring the oscillation frequency be equal to the tuned resonant frequency. In practice, various circuit level effects, such as component variations or parasitic capacitances, inductances, and/or resistances typically result in the oscillation frequency being different from the tuned resonant frequency, and in practice, the oscillation frequency and the tuned resonant frequency may differ by as much as thirty to fifty percent or more. As described in greater detail below, the capacitive elements 110, 112 capacitively couple the resonator arrangement 108 to the nodes 104, 106 of the active-circuit arrangement 102 in a manner that isolates the resonator arrangement 108 from the voltage at node 140 without appreciably impacting the resonant frequencies capable of being provided by the resonator arrangement 108.

It should be understood that FIG. 1 is a simplified representation of a VCO module 100 for purposes of explanation and ease of description, and FIG. 1 is not intended to limit the application or scope of the subject matter in any way. Thus, although FIG. 1 depicts direct electrical connections between circuit elements and/or terminals, alternative embodiments may employ intervening circuit elements and/or components while functioning in a substantially similar manner. For convenience, but without limitation, the subject matter may be described herein in the context of oscillating output signals being taken from or otherwise provided at nodes 104, 106. As described in greater detail below, the capacitive elements 110, 112 are effectively short-circuits at the oscillation frequency of the oscillating signals at nodes 104, 106, such that oscillating signals having their oscillation frequency governed or otherwise influenced by the tuned resonant frequency provided by the resonator arrangement 108 are also present or otherwise provided at nodes 132, 134, regardless of whether the nodes 104, 106 are being utilized as the output nodes of the VCO module 100. Accordingly, in other embodiments, oscillating output signals may be taken from nodes 132, 134 of the VCO module 100. Thus, although nodes 104, 106 may alternatively be referred to herein as output nodes of the VCO module 100 for purposes of explanation, it should be appreciated that in other embodiments, nodes 132, 134 may function as the output nodes of the VCO module 100.

In the illustrated embodiment, the active-circuit arrangement 102 is realized as cross-coupled oscillator arrangement that includes a pair of cross-coupled transistors 114, 116 configured to facilitate the oscillating signals at the output nodes 104, 106. In this regard, the oscillating signals at the output nodes 104, 106 are components of a differential oscillating signal, that is, the phase difference between the first oscillating signal at the first output node 104 and the second oscillating signal at the second output node 106 is substantially equal to 180°. In other words, the first oscillating signal at the first output node 104 is the logical inverse of the second oscillating signal at the second output node 106. As illustrated in FIG. 1, for an implementation using n-type transistors, the drain terminal of the first transistor 114 and the gate terminal of the second transistor 116 are each connected to the first output node 104, and the gate terminal of the first transistor 114 and the drain terminal of the second transistor 116 are each connected to the second output node 106. The source terminals of the transistors 114, 116 are connected to one another at a common source node 118, such that the gate and drain voltages of the transistors 114, 116 are all referenced relative to the same source voltage. As described in greater detail below, the output nodes 104, 106 are coupled to a node 140 configured to receive a positive reference voltage (or supply voltage) for the VCO module 100, and the common source node 118 is coupled to a node 150 configured to receive a ground reference voltage for the VCO module 100, wherein the voltage at node 140 functions as a bias voltage that biases the transistors 114, 116 in the saturation region, which results in the transistors 114, 116 oscillating between the on and off states at the tuned resonant frequency provided by the resonator arrangement 108 by virtue of the cross-coupled configuration. It should be noted that although FIG. 1 depicts an implementation using n-type MOSFETs (e.g., NMOS) for the active-circuit arrangement 102, numerous equivalent circuits may be implemented (e.g., using bipolar junction transistors or PMOS transistors for the active-circuit arrangement 102 with ground and supply terminals swapped) or the active-circuit arrangement 102 may be implemented in a complementary manner (e.g., using both NMOS and PMOS transistors).

As described above, the resonator arrangement 108 is capable of being tuned to a particular resonant frequency from a range of possible resonant frequencies, wherein the tuned resonant frequency dictates the oscillation frequency of the oscillating signals at the output nodes 104, 106. In exemplary embodiment, the resonator arrangement 108 is coupled to a first control voltage node 120 configured to receive a first control voltage and a second control voltage node 122 configured to receive a second control voltage, wherein the tuned resonant frequency of the resonator arrangement 108 is based on the voltage difference between the first control voltage at node 120 and the second control voltage at node 122.

As illustrated in FIG. 1, in an exemplary embodiment, the resonator arrangement 108 is realized as a tank circuit including a first variable capacitance element 124, a second variable capacitance element 126, a first inductive element 128, and a second inductive element 130. In the illustrated embodiment, the first variable capacitance element 124 is realized as a varactor having its cathode terminal connected to the first control voltage node 120, wherein the first inductive element 128 is connected between the second control voltage node 122 and the anode terminal of the first variable capacitive element 124 at node 132. In a similar manner, the second variable capacitance element 126 is realized as a varactor having its cathode terminal connected to the first control voltage node 120, wherein the second inductive element 130 is connected between the second control voltage node 122 and the anode terminal of the second variable capacitance element 126 at node 134. For convenience, but without limitation, the variable capacitance elements 124, 126 may alternatively be referred to herein as varactors. The direct current (DC) voltage difference between the first control voltage at node 120 and the second control voltage at node 122 is applied across the varactors 124, 126 to control the capacitance of the varactors 124, 126, and thereby, the resonant frequency provided by the resonator arrangement 108. In this regard, it should be noted by virtue of the resonator arrangement 108 having two control voltage nodes 120, 122, a wider range of voltages may be applied across the varactors 124, 126 (e.g., positive and negative voltages may be applied across the varactors 124, 126). Thus, when the variable capacitive elements 124, 126 are realized as MOS varactors, the varactors 124, 126 are capable of providing a wider range of possible capacitance values and thereby increasing the range of possible resonant frequencies for the resonator arrangement 108.

In an exemplary embodiment, the range of possible capacitances capable of being provided by the varactors 124, 126 with respect to the range of possible control voltages at the control voltage nodes 120, 122 and the inductances of the inductive elements 128, 130 are chosen to provide a desired range of possible resonant frequencies for the resonator arrangement 108. For example, in accordance with one embodiment, the inductive elements 128, 130 have an inductance of about 100 picohenries and the varactors 124, 126 are designed to have a capacitance of about 40 femtofarads to about 100 femtofarads over a control voltage differential from about −2.5 Volts to about 2.5 Volts to provide a range of possible oscillation frequencies for the VCO module 100 of about 36 GHz to about 46 GHz. In an exemplary embodiment, the inductive elements 128, 130 are realized as transmission lines configured to provide the desired inductance.

As illustrated in FIG. 1, the first capacitive element 110 is connected between the first output node 104 of the active-circuit arrangement 102 and node 132 of the resonator arrangement 108, and the second capacitive element 112 is connected between the second differential output node 106 of the active-circuit arrangement 102 and node 134 of the resonator arrangement 108. In this manner, the active-circuit arrangement 102 and the resonator arrangement 108 are capacitively coupled, that is, the active-circuit arrangement 102 and the resonator arrangement 108 are coupled via intervening capacitive elements 110, 112 configured electrically in series between the respective nodes 132, 134 of the resonator arrangement 108 and the respective output nodes 104, 106, such that the nodes 132, 134 of the resonator arrangement 108 are not directly connected to the output nodes 104, 106. In an exemplary embodiment, the capacitances of the capacitive elements 110, 112 are chosen such that the capacitive elements 110, 112 are effectively short-circuits (i.e., relatively low impedance) over the range of possible resonant frequencies for the resonator arrangement 108. For example, for the above described embodiment of a resonator arrangement 108 configured to provide a range of possible resonant frequencies of about 36 GHz to 46 GHz, the capacitive elements 110, 112 may be realized as capacitors having a capacitance of about 300 femtofarads or higher, such that the capacitive elements 110, 112 have relatively low impedance (e.g., about 15Ω or less) at or above 36 GHz. In this regard, the resonator arrangement 108 may be understood as being AC-coupled to the active-circuit arrangement 102, as the capacitive elements 110, 112 effectively isolate DC voltages or other signals at the output nodes 104, 106 having frequencies below the range of possible resonant frequencies for the resonator arrangement 108 from nodes 132, 134 of the resonator arrangement 108. By virtue of the capacitive elements 110, 112 being effectively short-circuits over the range of possible resonant frequencies for the resonator arrangement 108; the capacitive elements 110, 112 have minimal influence on the oscillating frequency of the oscillating signals at the output nodes 104, 106.

As described above, in an exemplary embodiment, the output nodes 104, 106 of the active-circuit arrangement 102 are coupled to a supply voltage node 140 configured to receive a supply voltage (or bias voltage) that biases the transistors 114, 116 to provide negative transconductance and facilitate generation of oscillating signals at the output nodes 104, 106 having an oscillation frequency corresponding to the tuned resonant frequency of the resonator arrangement 108. By virtue of the capacitive elements 110, 112 being effectively open circuits at lower frequencies (e.g., frequencies below the range of possible resonant frequencies provided by the resonator arrangement 108), the DC voltage at the supply voltage node 140 is effectively isolated from the nodes 132, 134 of the resonator arrangement 108, and thus, the supply voltage at node 140 is effectively isolated from the varactors 124, 126. As a result, variations in the supply voltage at the supply voltage node 140 are not transferred to nodes 132, 134, and thus, do not appreciably impact the voltages at the nodes 132, 134 of the resonator arrangement 108. Accordingly, the capacitances of the varactors 124, 126 are not influenced by the supply voltage at the supply voltage node 140 and the range of possible resonant frequencies for the resonator arrangement 108 is not influenced by variations in the supply voltage. Rather, the capacitances of the varactors 124, 126 are based on the voltage differential between the control voltages applied at the control voltage nodes 120, 122, as described above.

In an exemplary embodiment, a first inductive element 142 is connected between the supply voltage node 140 and the first output node 104 and a second inductive element 144 is connected between the supply voltage node 140 and the second output node 106. In accordance with one or more embodiments, the first and second inductive elements 142, 144 are each realized as transmission line elements configured as a quarter wave impedance transformer at the oscillating frequency of the oscillating output signals at the output nodes 104, 106, such that the transmission line elements 142, 144 terminated at the supply voltage node 140 (which is effectively an RF ground) are effectively open circuits at the oscillating frequency. In this regard, the first and second transmission line elements 142, 144 may each be configured as a quarter wave impedance transformer at the oscillating frequency at the midpoint of the range of possible oscillating frequencies capable of being provided by the VCO module 100. For example, for capacitance/inductance value for range from 36 GHz to about 46 GHz, the first and second transmission line elements 142, 144 may be realized as quarter wave impedance transformers at 43 GHz). When realized as quarter wave impedance transformers at the oscillating frequency, the first and second transmission line elements 142, 144 further isolate the supply voltage node 140 from the nodes 132, 134 of the resonator arrangement 108 without influencing the oscillation frequency of the differential output signals produced by the active-circuit arrangement 102. It should be appreciated that the first and second transmission line elements 142, 144 are not intended to be limited to quarter wave impedance transformers at the oscillation frequency, and in other practical embodiments, the impedance of the first and second transmission line elements 142, 144 may be chosen to influence the oscillation frequency (or the range thereof) for the VCO module 100 to suit the needs of a particular application.

In an exemplary embodiment, a third transmission line element 146 is connected between the common source node 118 and the ground voltage node 150. In accordance with one or more embodiments, the third transmission line element 146 is configured as a quarter wave impedance transformer at twice the oscillating frequency for the oscillating output signals at the output nodes 104, 106 (e.g., a quarter wave impedance transformer at double the oscillating frequency at the midpoint of the range of possible resonant frequencies capable of being provided by the VCO module 100). In this regard, the third transmission line element 146 is effectively an open circuit at the second harmonic of the oscillating frequency to reduce the phase noise of the VCO module 100. It should be appreciated that the third transmission line element 146 is not intended to be limited to a quarter wave impedance transformer at the twice the oscillation frequency of the VCO module 100, and in other practical embodiments, the impedance of the third transmission line element 146 may be chosen to target different harmonics of the oscillation frequency or may otherwise be modified to influence the oscillation frequency of the VCO module 100 to suit the needs of a particular situation. Additionally, in other embodiments of the VCO module 100, the third transmission line element 146 may not be present, that is, the common source node 118 (i.e., the source terminals of transistors 114, 116) may be connected directly to the ground voltage node 150.

Figure 2:
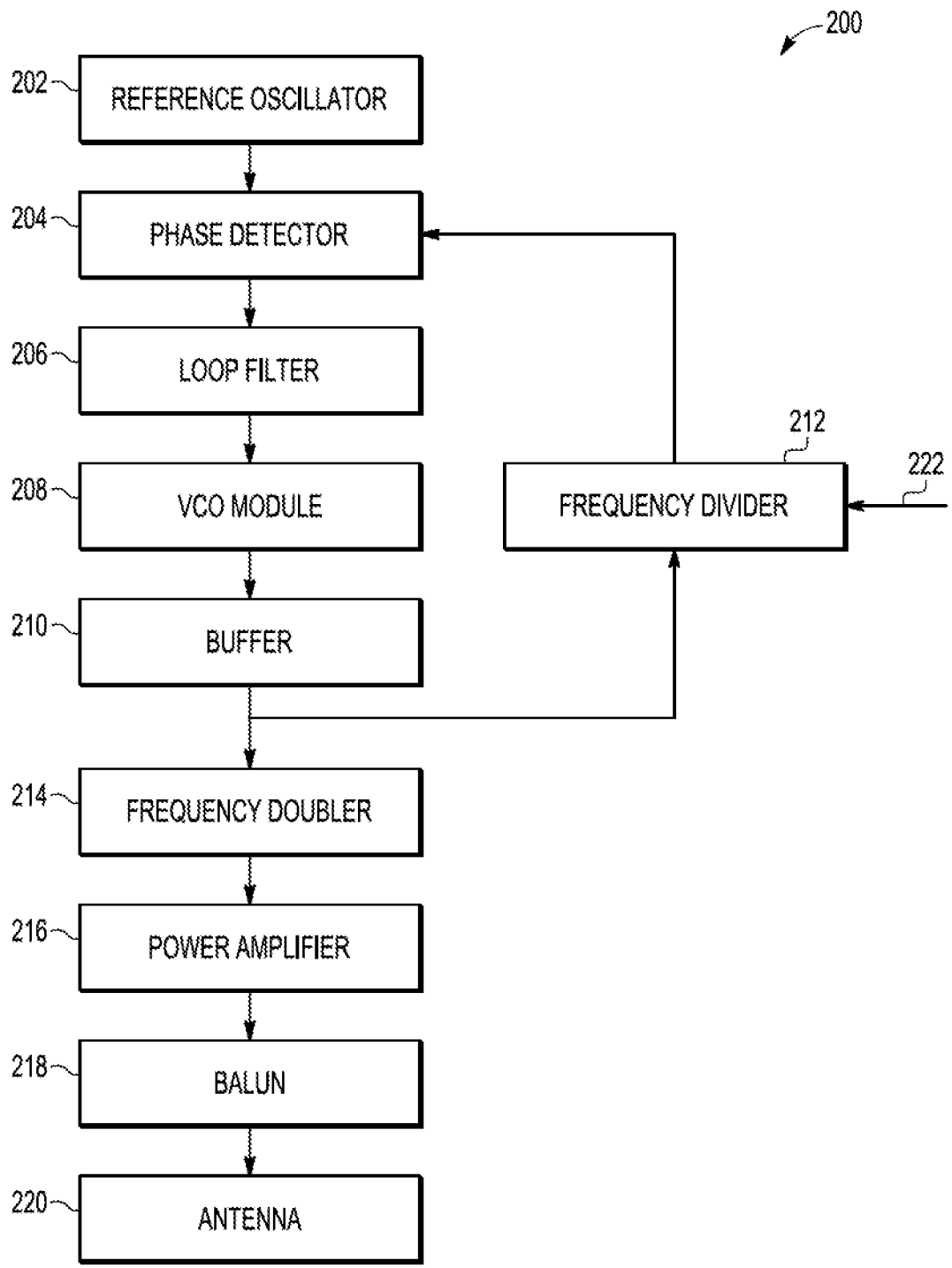
FIG. 2 is a block diagram of a transmitter system suitable for use with the voltage-controlled oscillator module of FIG. 3 in accordance with a further embodiment of the invention.
Figure 3:
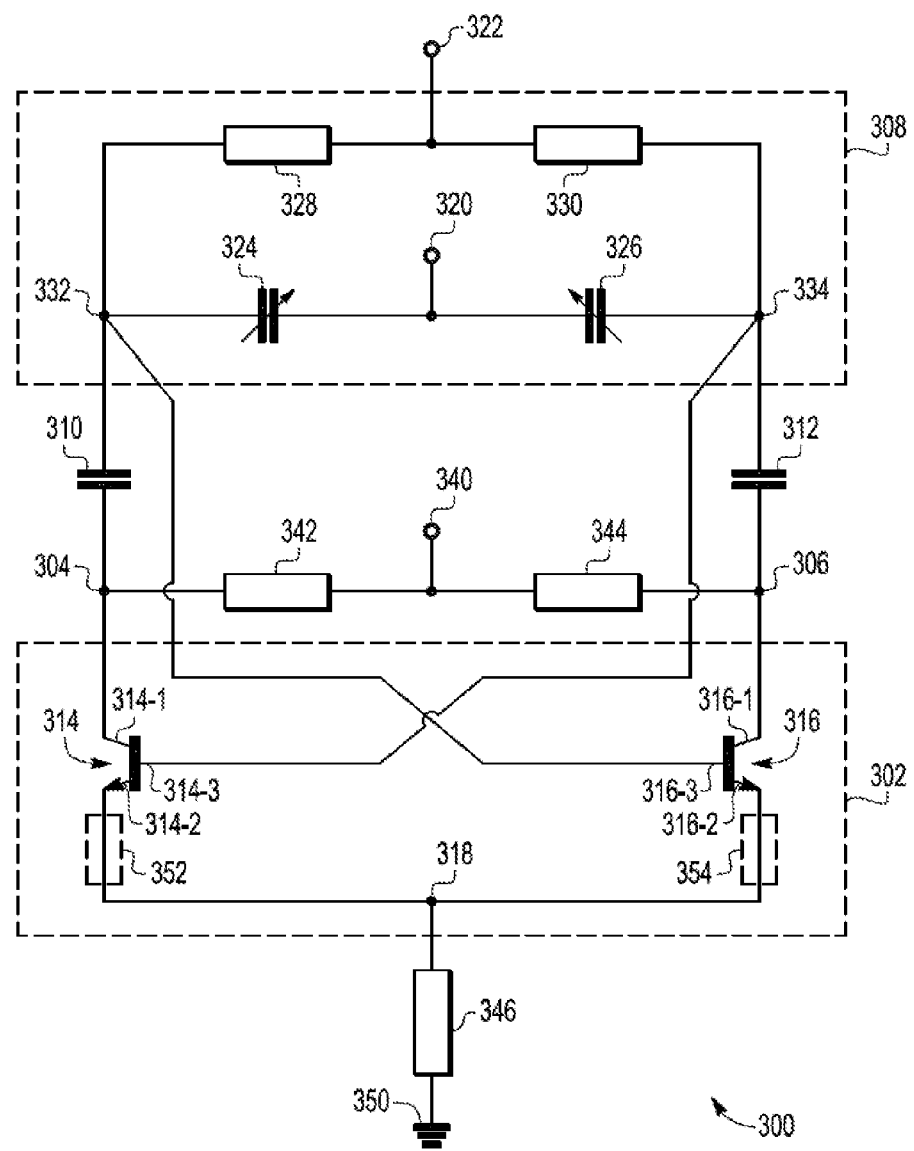
FIG. 3 is a schematic view of a voltage-controlled oscillator module in accordance with another embodiment of the invention.

FIG. 2 depicts an exemplary embodiment of a transmitter system 200 suitable for use with the VCO module 100 of FIG. 1 and the VCO module 300 of FIG. 3. It should be understood that FIG. 2 is a simplified representation of a transmitter system for purposes of explanation and ease of description, and FIG. 2 is not intended to limit the application or scope of the subject matter in any way. Along these lines, it will be appreciated that the transmitter system 200 of FIG. 2 is merely one exemplary system that may utilize the VCO module 100 of FIG. 1, and the VCO module 100 of FIG. 1 may be utilized in a variety of different electrical systems and the VCO module 100 FIG. 1 is not intended to be limited to implementation in any particular system. Further, it will be appreciated that the transmitter system 200 of FIG. 2 is merely one exemplary system that may utilize the VCO module 300 of FIG. 3, and the VCO module 300 of FIG. 3 may be utilized in a variety of different electrical systems and the VCO module 300 of FIG. 3 is not intended to be limited to implementation in any particular system.

The illustrated embodiment of the transmitter system 200 includes, without limitation, a reference oscillator 202, a phase detector 204, a loop filter 206, a VCO module 208, a buffer 210, a frequency divider arrangement 212, a frequency doubler 214, a power amplifier 216, a balun 218, and an antenna 220. In the illustrated embodiment of FIG. 2, the reference oscillator 202, the phase detector 204, the loop filter 206, the VCO module 208, the buffer 210, and the frequency divider arrangement 212 are configured as a phase-locked loop (PLL) that produces a frequency modulated oscillating signal having a desired oscillation frequency based on an input signal provided to an input 222 of the transmitter system 200, as described in greater detail below. In accordance with one or more embodiments, the transmitter system 200 is configured for automotive radar applications, wherein the VCO module 208 is configured for oscillation frequencies within the range of about 38 GHz to about 41 GHz and the frequency modulated signals transmitted by the antenna 220 have a frequency in the range of about 76 GHz to about 81 GHz. It should be understood that FIG. 2 is a simplified representation of a transmitter system 200 for purposes of explanation and ease of description, and FIG. 2 is not intended to limit the application or scope of the subject matter described herein in any way.

In the illustrated embodiment, the reference oscillator 202 is realized as an oscillator that generates a reference signal having a fixed reference frequency, such as, for example, a crystal oscillator. The phase detector 204 is coupled to the reference oscillator 202 and the frequency divider arrangement 212, and the phase detector 204 compares the reference signal from the reference oscillator to the feedback signal from the frequency divider arrangement 212 and generates an error signal based on the difference between the frequencies and/or phases of the feedback signal and the reference signal. In accordance with one embodiment, the error signal from the phase detector 204 comprises an 'up' or 'down' pulse that produces a corresponding increase or decrease in a reference voltage differential provided to the VCO module 208 that is proportional to the duration of the pulse. The loop filter 206 comprises an analog filter that filters the error signal from the phase detector 204 to obtain a reference voltage differential which varies based on differences (e.g., in frequency and/or phase) between the reference signal and the feedback signal until the feedback signal is in phase-lock with or otherwise matches the reference signal. It will be appreciated that the loop filter 206 also provides a dominant pole for the PLL, thereby ensuring stability for the PLL. The buffer 210 is coupled to the output of the VCO module 208 and prevents the resulting load from the frequency divider arrangement 212 and/or frequency doubler 214 from undesirably impacting the oscillation frequency of the VCO module 208. The frequency divider arrangement 212 is coupled between the output of the VCO module 208 (via the buffer 210) and the input to the phase detector 204, and the frequency divider arrangement 212 is configured to generate or otherwise provide the feedback signal at a frequency that is equal to a fraction of the oscillation frequency of the oscillating signal(s) from the VCO module 208, wherein the fractional amount is determined based on the input signal provided at the input 222 of the transmitter system 200. In an exemplary embodiment, the frequency divider arrangement 212 is configured to support or otherwise implement frequency modulated continuous wave signals generated by the PLL that are representative of the input signal received at the input 222. In this regard, although not illustrated in FIG. 2, in practice, the frequency divider arrangement 212 may include modulators, ramp generators, and other components suitably configured to support frequency modulation, as will be appreciated in the art.

In an exemplary embodiment, the VCO module 208 is realized as a VCO module 100 as described above in the context of FIG. 1, or as VCO module 300 described later in the context of FIGS. 3-4, wherein the reference voltage differential from the loop filter 206 is provided to the control voltage nodes 120, 122 (or 320, 322) to control the capacitance of the varactors 124, 126 (or 324, 326), and thereby, the oscillation frequency of the differential oscillating signals at the output nodes 104, 106 (or 304, 306), which are representative of frequency modulated signals to be transmitted by the transmitter system 200. It should be noted that in other embodiments, the VCO module 100, 300 may be utilized in a non-differential manner and/or the PLL for the transmitter system 200 may be implemented in a non-differential manner by coupling only one of the control voltage nodes (e.g., control voltage node 120, 320) to the output of the loop filter 206 while the other control voltage node (e.g., control voltage node 122, 322) is coupled to a fixed reference voltage. In the illustrated embodiment, the output of the VCO module 208 (e.g., output nodes 104, 106 or 304, 306), is coupled to the frequency doubler 214 (via buffer 210), which doubles the frequency of the differential oscillating signals received from the output nodes 104, 106 or 304, 306. The output of the frequency doubler 214 is provided to a power amplifier 216, which amplifies the differential oscillating signals. The output of the power amplifier 216 is provided to the input of a balun 218, which is configured to convert the amplified differential oscillating signal to a single-ended oscillating signal with the same oscillating frequency. In an exemplary embodiment, the antenna 220 is realized as a conductive element that is coupled to the output of the balun 218 and configured to generate or otherwise produce electromagnetic waves at a frequency corresponding to the frequency of the single-ended oscillating signal received from the balun 218. In this manner, the antenna 220 transmits or otherwise emits an electromagnetic signal having a frequency that is influenced by the oscillating frequency of the oscillating signals provided by the VCO module 208, which in this example, corresponds to twice the oscillating frequency of the VCO module 208 by virtue of the frequency doubler 214. For example, if the VCO module 208 is producing oscillating signals with an oscillation frequency of 39 GHz, the antenna 220 transmits frequency modulated electromagnetic signals having a frequency of 78 GHz.

For the sake of brevity, conventional techniques related to electronic oscillators and/or VCOs, resonators and/or tank circuits, variable capacitance elements and/or varactors, field-effect transistors (FETs), analog circuit design, PLLs, transmitters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" or "directly connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Figure 4:
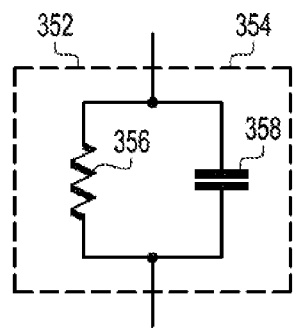
FIG. 4 is a simplified schematic diagram of a portion of the voltage controlled oscillator of FIG. 3 in accordance with a still another embodiment and showing further detail.

FIG. 3 depicts another exemplary embodiment of a voltage-controlled oscillator (VCO) module 300 and FIG. 4 depicts a simplified schematic arrangement of portion 352, 354 of VCO module 300 of FIG. 3, showing further detail. While module 300 of FIG. 3 is in some respects similar to module 100 of FIG. 1, module 300 illustrates an exemplary embodiment that utilizes bipolar transistors as amplifying elements 314, 316 rather than the field effect transistors 114, 116 of module 100 and has different internal connections For convenience of description, amplifying elements 314, 316 are depicted in FIG. 3 as bipolar transistors, but it should be understood that other device types, including field effect transistors may also be used as amplifying elements 314, 316 and that, as used herein, the term "amplifying element", singular or plural, is intended to include any type of amplifying device. Module 300 includes without limitation, an active-circuit arrangement 302 configured to facilitate generation of a pair of oscillating signals at a pair of nodes 304, 306, a resonator arrangement 308, and a pair of capacitive elements 310, 312 coupled between the nodes 304, 306 of the active-circuit arrangement 302 and nodes 332, 334 of resonator arrangement 308. The resonator arrangement 308 is capable of being tuned to a particular resonant frequency from a range of possible resonant frequencies, wherein the frequency of the oscillating signals at the nodes 304, 306 is governed or otherwise influenced by the tuned resonant frequency provided by the resonator arrangement 308 at nodes 332, 334. As used herein, "oscillation frequency," "oscillating frequency," and variants thereof should be understood as referring to the frequency of the oscillating signals at the nodes 304, 306 and 332, 334. Furthermore, "corresponding to" and other words of similar import may be used herein to describe the relationship between the oscillation frequency and the tuned resonant frequency, and should not be construed as implying or otherwise requiring the oscillation frequency be equal to the tuned resonant frequency. In practice, various circuit level effects, such as component variations or parasitic capacitances, inductances, and/or resistances typically result in the oscillation frequency being different from the tuned resonant frequency, and in practice, the oscillation frequency and the tuned resonant frequency may differ by as much as thirty to fifty percent or more. As described in greater detail below, the capacitive elements 310, 312 capacitively couple resonator nodes 332, 334 of the resonator arrangement 308 to output nodes 304, 306 of the active-circuit arrangement 302 in a manner that DC isolates the resonator arrangement 308 from the voltage at node 340 without appreciably impacting the resonant frequencies capable of being provided by the resonator arrangement 308.

It should be understood that FIG. 3 is a simplified representation of a VCO module 300 for purposes of explanation and ease of description, and FIG. 3 is not intended to limit the application or scope of the subject matter in any way. Thus, although FIG. 3 depicts direct electrical connections between circuit elements and/or terminals, alternative embodiments may employ intervening circuit elements and/or components while functioning in a substantially similar manner. For convenience, but without limitation, the subject matter may be described herein in the context of oscillating output signals being taken from or otherwise provided at nodes 304, 306. As described in greater detail below, the capacitive elements 310, 312 are effectively short-circuits at the frequency of the oscillating signals at nodes 304, 306, such that signals having their oscillation frequency governed or otherwise influenced by the tuned resonant frequency provided by the resonator arrangement 308 are also present or otherwise provided at resonator nodes 332, 334, regardless of whether the nodes 304, 306 are being utilized as the output nodes of the VCO module 300. Accordingly, in other embodiments, oscillating output signals may be taken from resonator nodes 332, 334 of the VCO module 300. Thus, although nodes 304, 306 may alternatively be referred to herein as output nodes of the VCO module 300 for purposes of explanation, it should be appreciated that in other embodiments, resonator nodes 332, 334 may function as the output nodes of the VCO module 300.

In the illustrated embodiment, the active-circuit arrangement 302 is realized as a cross-coupled oscillator arrangement that includes a pair of cross-coupled amplifying elements 314, 316 configured to facilitate the oscillating signals at the output nodes 304, 306. In this regard, the oscillating signals at the output nodes 304, 306 are components of a differential oscillating signal, that is, the phase difference between the first oscillating signal at the first output node 304 and the second oscillating signal at the second output node 306 is substantially equal to 180°. In other words, the first oscillating signal at the first output node 304 is the logical inverse of the second oscillating signal at the second output node 306. As illustrated in FIG. 3, for an implementation using NPN bipolar transistors as amplifying elements 314, 316, first main terminal 314-1 (e.g., the collector terminal) of the first amplifying element 314 is coupled to first output node 304 and the first main terminal 316-1 (e.g., the collector terminal) of second amplifying element 316 is coupled to second output node 306. The control terminal 314-3 (e.g., the base terminal) of the first amplifying element 314 is cross-coupled to node 334 and the control terminal 316-3 (e.g., the base terminal) of the second amplifying element 316 is cross-coupled to node 332. Unlike the arrangement of VCO module 100 of FIG. 1, because of the presence of capacitor 310 between first output node 304 and node 332 and because of the presence of capacitor 312 between second output node 306 and node 334, the cross-coupled control terminals 314-3, 316-3 of amplifying elements 314, 316 going to nodes 334, 332 respectively are AC coupled but not DC coupled to output nodes 304, 306. This has the result of substantially reducing or eliminating distortion during large signal operation that can be caused, for example, by forward biasing of the collector-base junctions of bipolar transistors when such transistors are used as amplifying elements 314, 316. Thus, the arrangement depicted in the embodiment of FIG. 3, among other things, allows bipolar transistors to be used as amplifying elements 314, 316 without significant output power and phase noise degradation.

The second main terminals 314-2, 316-2 (e.g., emitter terminals) of the amplifying elements 314, 316 are coupled to one another at a common reference node 318, such that the terminal voltages of the amplifying elements 314, 316 are all referenced relative to the same main terminal voltage. As described in greater detail below, the output nodes 304, 306 are coupled to a node 340 configured to receive a (e.g., positive) reference voltage or supply voltage for the VCO module 300, and the common (e.g., reference) node 318 is coupled to a node 350 configured to receive a ground or other reference voltage for the VCO module 300, wherein the voltage at node 340 functions as a supply voltage that biases the amplifying elements 314, 316 in the saturation region. This results in the amplifying elements 314, 316 oscillating between the on and off states at the tuned resonant frequency provided by the resonator arrangement 308 by virtue of the cross-coupled configuration. It should be noted that although FIG. 3 depicts an implementation using N-type amplifying elements (e.g., NPN bipolar transistors) for the active-circuit arrangement 302, numerous other circuits may be implemented (e.g., using P-type amplifying elements) for the active-circuit arrangement 302 (e.g., with ground and supply terminal polarity swapped), and/or using other types of or combinations of amplifying devices.

As described above, the resonator arrangement 308 is capable of being tuned to a particular resonant frequency from a range of possible resonant frequencies, wherein the tuned resonant frequency dictates the oscillation frequency of the oscillating signals at the output nodes 304, 306. In exemplary embodiment, the resonator arrangement 308 is coupled to a first control voltage node 320 configured to receive a first control voltage and a second control voltage node 322 configured to receive a second control voltage, wherein the tuned resonant frequency of the resonator arrangement 308 is based on the voltage difference between the first control voltage at node 320 and the second control voltage at node 322.

As illustrated in FIG. 3, in an exemplary embodiment, the resonator arrangement 308 is realized as a tank circuit including a first variable capacitance element 324, a second variable capacitance element 326, a first inductive element 328, and a second inductive element 330. In the illustrated embodiment, the first variable capacitance element 324 is realized as a varactor having one terminal coupled to the first control voltage node 320, wherein the first inductive element 328 is coupled at node 332 between the second control voltage node 322 and the other terminal of the first variable capacitive element 324. In a similar manner, the second variable capacitance element 326 is realized as a varactor having its first terminal coupled to the first control voltage node 320, wherein the second inductive element 330 is coupled at node 334 between the second control voltage node 322 and the second terminal of the second variable capacitance element 326. For convenience, but without limitation, the variable capacitance elements 324, 326 may alternatively be referred to herein as varactors. The direct current (DC) voltage difference between the first control voltage at node 320 and the second control voltage at node 322 is applied across the varactors 324, 326 to control the capacitance of the varactors 324, 326, and thereby the resonant frequency provided by the resonator arrangement 308. In this regard, it should be noted that, due to the DC coupling between node 322 and the control terminals 314-3, 316-3 of amplifying elements 314, 316 of module 300, the voltage applied to node 322 may be used to bias the control terminals 314-3, 316-3 of amplifying elements 314, 316, thereby insuring that amplifying elements 314, 316 function in the desired operating range, while still allowing the varactor voltage, and therefore the oscillating frequency of module 300, to be controlled by means of the bias applied to node 320. This is important to reduce oscillator noise that can be caused by improper control terminal bias.

In another exemplary embodiment, the range of possible capacitances capable of being provided by the varactors 324, 326 with respect to the range of possible control voltages at the control and bias voltage nodes 320, 322 and the inductances of the inductive elements 328, 330 are chosen to provide a desired range of possible resonant frequencies for the resonator arrangement 308. For example, in accordance with one embodiment, the inductive elements 328, 330 have an inductance of about 300 picohenries and the varactors 324, 326 are designed to have a capacitance of about 40 femtofarads to about 300 femtofarads over a control voltage differential from about −2.5 Volts to about 2.5 Volts to provide a range of possible oscillation frequencies for the VCO module 300 of about 36 GHz to about 46 GHz. In an exemplary embodiment, the inductive elements 328, 330 are realized as transmission lines configured to provide the desired inductance.

As illustrated in FIG. 3, the first capacitive element 310 is coupled between the first output node 304 of the active-circuit arrangement 302 and node 332 of the resonator arrangement 308, and the second capacitive element 312 is coupled between the second output node 306 of the active-circuit arrangement 302 and node 334 of the resonator arrangement 308. In this manner, the active-circuit arrangement 302 and the resonator arrangement 308 are capacitively coupled, that is, the active-circuit arrangement 302 and the resonator arrangement 308 are coupled via intervening capacitive elements 310, 312 configured electrically in series between the respective resonator nodes 332, 334 of the resonator arrangement 308 and the respective output nodes 304, 306 of active-circuit arrangement 302, such that the resonator nodes 332, 334 of the resonator arrangement 308 are AC coupled but not DC coupled to the output nodes 304, 306 of the active-circuit arrangement 302. In an exemplary embodiment, the capacitances of the capacitive elements 310, 312 are chosen such that the capacitive elements 310, 312 are effectively AC short-circuits (i.e., have relatively low impedance) over the range of possible resonant frequencies for the resonator arrangement 308. For example, for the above described embodiment of a resonator arrangement 308 configured to provide a range of possible resonant frequencies of about 36 GHz to 46 GHz, the capacitive elements 310, 312 may be realized as capacitors having a capacitance of about 300 femtofarads or higher, such that the capacitive elements 310, 312 have relatively low impedance (e.g., about 15Ω or less) at or above 36 GHz. In this regard, the resonator arrangement 308 may be understood as being AC-coupled to the active-circuit arrangement 302, while the capacitive elements 310, 312 effectively isolate DC voltages or other signals at the output nodes 304, 306 having frequencies below the range of possible resonant frequencies for the resonator arrangement 308 at resonator nodes 332, 334. By virtue of the capacitive elements 310, 312 being effectively short-circuits over the range of possible resonant frequencies for the resonator arrangement 308, the capacitive elements 310, 312 have minimal influence on the oscillating frequency of the oscillating signals at the output nodes 304, 306 while still allowing the proper DC bias to be provided for the control terminals 314-3, 316-3 of amplifying elements 314, 316.

As described above, in an exemplary embodiment, the output nodes 304, 306 of the active-circuit arrangement 302 are coupled to a supply voltage node 340 configured to receive a supply voltage (or bias voltage) that biases the amplifying elements 314, 316 to provide negative transconductance and facilitate generation of oscillating signals at the output nodes 304, 306 having an oscillation frequency corresponding to the tuned resonant frequency of the resonator arrangement 308. By virtue of the capacitive elements 310, 312 being effectively open circuits at lower frequencies (e.g., frequencies below the range of possible resonant frequencies provided by the resonator arrangement 308), the DC voltage at the supply voltage node 340 is effectively isolated from the nodes 332, 334 of the resonator arrangement 308, and thus, the supply voltage at node 340 is effectively isolated from the varactors 324, 326. As a result, variations in the supply voltage at the supply voltage node 340 are not transferred to nodes 332, 334, and thus, do not appreciably impact the voltages at the resonator nodes 332, 334 of the resonator arrangement 308. Accordingly, the capacitances of the varactors 324, 326 are not influenced by the supply voltage at the supply voltage node 340 and the range of possible resonant frequencies for the resonator arrangement 308 is not influenced by variations in the supply voltage. Rather, the capacitances of the varactors 324, 326 are based on the voltage differential between the frequency control voltage applied at the varactor control voltage node 320 and the control terminal bias voltage applied at node 322, as described above. Accordingly, node or terminal 322 can be used to set the amplifying element control terminal bias voltage or current and node or terminal 320 can be used to set the varactor voltage and therefore the oscillation frequency. Because varactors 324, 326 are inherently capacitive, relatively low frequency variations of the voltage applied at node or terminal 320 to set the oscillation frequency do not significantly affect the control terminal bias voltage determined by the voltage on node 322. The ability to separately determine the amplifying element control terminal bias voltage or current and substantially independently determine the varactor control voltage via separate terminals or nodes is extremely useful in obtaining a low noise oscillator output signal.

In an exemplary embodiment, a first inductive element 342 is coupled between the supply voltage node 340 and the first output node 304 and a second inductive element 344 is coupled between the supply voltage node 340 and the second output node 306. In accordance with one or more embodiments, the first and second inductive elements 342, 344 are each realized as transmission line elements configured as a quarter wave impedance transformer at the oscillating frequency of the oscillating output signals at the output nodes 304, 306, such that the transmission line elements 342, 344 terminated at the supply voltage node 340 (which is effectively an RF ground) are effectively open circuits at the oscillating frequency. In this regard, the first and second transmission line elements 342, 344 may each be configured as a quarter wave impedance transformer at the oscillating frequency at the midpoint of the range of possible oscillating frequencies capable of being provided by the VCO module 300. For example, for capacitance/inductance value for range from 36 GHz to about 46 GHz, the first and second transmission line elements 342, 344 may be realized as quarter wave impedance transformers at 43 GHz). When realized as quarter wave impedance transformers at the oscillating frequency, the first and second transmission line elements 342, 344 further isolate the supply voltage node 340 from the nodes 332, 334 of the resonator arrangement 308 without influencing the oscillation frequency of the differential output signals produced by the active-circuit arrangement 302. It should be appreciated that the first and second transmission line elements 342, 344 are not intended to be limited to quarter wave impedance transformers at the oscillation frequency, and in other practical embodiments, the impedance of the first and second transmission line elements 342, 344 may be chosen to influence the oscillation frequency (or the range thereof) for the VCO module 300 to suit the needs of a particular application.

In another exemplary embodiment, a third transmission line element 346 is coupled between the common (e.g., emitter) node 318 and the ground or reference voltage node 350. In accordance with one or more embodiments, the third transmission line element 346 is configured as a quarter wave impedance transformer at twice the oscillating frequency for the oscillating output signals at the output nodes 304, 306 (e.g., a quarter wave impedance transformer at double the oscillating frequency at the midpoint of the range of possible resonant frequencies capable of being provided by the VCO module 300). In this regard, the third transmission line element 346 is effectively an open circuit at the second harmonic of the oscillating frequency to reduce the phase noise of the VCO module 300. It should be appreciated that the third transmission line element 346 is not intended to be limited to a quarter wave impedance transformer at the twice the oscillation frequency of the VCO module 300, and in other practical embodiments, the impedance of the third transmission line element 346 may be chosen to target different harmonics of the oscillation frequency, or may otherwise be modified to influence the oscillation frequency of the VCO module 300 to suit the needs of a particular application. Additionally, in other embodiments of the VCO module 300, the third transmission line element 346 may not be present, that is, the common node 318 (i.e., the second main terminals of amplifying elements 314, 316) may be connected directly to the ground or reference voltage node 350.

Referring now to FIGS. 3-4, in a still another embodiment, optional impedances 352, 354 may be provided between the second main (e.g., emitter) terminals of amplifying elements 314, 316 respectively and common node 318. Impedances 352, 354 are illustrated in more detail in FIG. 4, as being a parallel arrangement of resistor 356 and capacitance 358. Resistor 356 (e.g., about 50 Ohms) is selected in combination with the control terminal bias voltage at node 322, to define an appropriate bias current or voltage in the active circuitry. Capacitance 358 (e.g., about 1 Pico-farad) is provided to substantially short-circuit the resistor 356 for AC signals.

In conclusion, systems, devices, and apparatus configured in accordance with a first exemplary embodiment of the invention may be used for a voltage-controlled oscillator module (300), comprising, an active-circuit arrangement (302) facilitating generation of an oscillating signal and having first (304) and second (306) principal nodes, and utilizing first (314) and second (316) amplifying elements, each with first and second main terminals (314-1, 314-2; 316-1, 316-2) and a control terminal (314-3, 316-3), wherein the first principal node (304) is coupled to the first main terminal (314-1) of the first amplifying element (314) and the second principal node (306) is coupled to the first main terminal (316-1) of the second amplifying element (316), a resonator arrangement (308) having a first resonator node (332) and a second resonator node (334), wherein the first resonator node (332) is capacitively coupled to the first principal node (304) and the second resonator node (334) is capacitively coupled to the second principal node (306), and wherein the control terminal (314-3) of the first amplifying element (314) is cross coupled to the second resonator node (334) and the control terminal (316-3) of the second amplifying element (316) is cross coupled to the first resonator node (332). According to a further embodiment, the first (304) and second (306) principal nodes function as output nodes of the voltage-controlled oscillator module (300), or wherein the first (332) and second (334) resonator nodes are adapted to function as output nodes of the voltage-controlled oscillator module (300) first and second resonator nodes, respectively. According to a still further embodiment, the first (304) and second (306) principal nodes are AC but not DC coupled to the first (322) and second (334) resonator nodes, respectively. According to a yet further embodiment, the second main terminals (314-2, 316-2) of the first and second amplifying elements (314, 316) are coupled to a common reference terminal (350). According to a still yet further embodiment, capacitive coupling is provided by capacitive elements (310, 312) that provide DC isolation but are effectively short-circuits at a frequency of the oscillating signal. According to a yet still further embodiment, the voltage-controlled oscillator module (300) further comprises a further voltage node (340) adapted to receive a third voltage providing power to the active-circuit arrangement (302), wherein the capacitive elements (310, 312) substantially isolate the resonator arrangement (308) from the further voltage node (340) at frequencies significantly lower than a frequency of the oscillating signal. According to another embodiment, the resonator arrangement (308) further comprises a second control voltage terminal (322) coupled to the first (332) and second (334) resonator nodes. According to a still another embodiment, the second control voltage terminal (322) is coupled to the first (332) resonator node by a first inductive element (328) and to the second (334) resonator node by a second inductive element (330). According to a yet another embodiment, the first inductive element (328) and the second inductive element (330) are transmission line segments. According to a still yet another embodiment, the second main terminals (314-2, 316-2) of the first and second amplifying elements (314, 316) are coupled to the common reference terminal (350) by a frequency dependent impedance (346). According to a yet still another embodiment, the second main terminal (314-2) of the first amplifying element (314) is coupled to the common reference terminal (350) by a further frequency dependent impedance (352) and the second terminal (316-2) of the second amplifying element (316) is coupled to the common reference terminal (350) by a still further frequency dependent impedance (354). According to an additional embodiment, the further frequency dependent impedance (352) and the still further frequency dependent impedance (354) are coupled to a common node (318) which is coupled to the common reference terminal (350) by a still additional frequency dependent impedance (346). According to a still additional embodiment, the further frequency dependent impedance (352) and the still further frequency dependent impedance (354) are parallel combinations of a resistor and a capacitor.

According to a second embodiment, there is provided a voltage-controlled oscillator (300) comprising, a first node (340) adapted to receive a first voltage, a second node (320) adapted to receive a second voltage, a third node (322) adapted to receive a third voltage, a fourth (304) node adapted for receiving a first oscillating signal, a fifth node (306) adapted for receiving a second oscillating signal, an active-circuit arrangement (302) adapted to facilitate the first oscillating signal at the fourth node (304) and the second oscillating signal at the fifth node (306), the active-circuit arrangement (302) being coupled to the first node (340), a resonator arrangement (308) coupled to the second node (320) and the third node (322), the resonator arrangement (308) adapted to substantially determine an oscillation frequency for the first oscillating signal at a first resonator node (332) and adapted to substantially determine an oscillating frequency for the second oscillating signal at a second oscillator node (334), wherein the oscillating signals at the first (322) and second (334) resonator nodes are based on a difference between the voltages at the second (320) and third (322) nodes, a first capacitive element (310) coupled between the fourth node (304) and the first resonator node (332), a second capacitive element (312) coupled between the fifth node (306) and the second resonator node (334), and wherein the active-circuit arrangement (302) comprises a first amplifying element (314) having a first main terminal (314-1) thereof coupled to the fourth node (304) and a second amplifying element (316) having a first main terminal (316-1) thereof coupled to the fifth node (306), and wherein control terminals (314-3, 316-3) of the first (314) and second (316) amplifying elements are cross-coupled, respectively, to the second (334) and first (332) resonator nodes. According to a further embodiment, the voltage-controlled oscillator (300) further comprises, a first inductive element (342) coupled between the first node (340) and the fourth node (304), and a second inductive element (344) coupled between the first node (340) and the fifth node (306). According to a still further embodiment, the first inductive element (342) and the second inductive element (344) are each configured substantially as a quarter wave impedance transformer at the oscillation frequency. According to a yet further embodiment, voltage-controlled oscillator (300) further comprises a reference node (350) configured to receive a reference voltage, and a third inductive element (346) coupled between the reference node (350) and the active-circuit arrangement (302). According to a still yet further embodiment, the resonator arrangement (308) includes, a first varactor (324) coupled between the second node (320) and the first resonator node (332), a second varactor (326) coupled between the second node (320) and the second resonator node (334), a first inductive element (328) coupled between the third node (322) and the first resonator node (332), and a second inductive element (330) coupled between the third node (322) and the second resonator node (334).

According to a third embodiment, there is provided a voltage controlled oscillator (VCO) module (300) adapted to generate an oscillating frequency, comprising, a resonator arrangement (308) having a first varactor (324) whose first terminal is coupled to a first control voltage node (320) and whose second terminal is coupled at a first resonator node (332) to a first frequency dependent impedance (328) coupled to a second bias voltage node (322), and having a second varactor (326) whose first terminal is coupled to the first control voltage node (320) and whose second terminal is coupled at a second resonator node (334) to a second frequency dependent impedance (330) coupled to the second bias voltage node (322), wherein a voltage applied between the first control voltage node (320) and second bias voltage node (322) determines at least in part the oscillating frequency of the VCO module (300), and an active circuit arrangement (302) employing first (314) and second (316) amplifying elements, the first amplifying element (314) having a first main terminal (314-1) AC coupled to the first resonator node (332) and a control terminal (314-3) AC and DC coupled to the second resonator terminal (334), and the second amplifying element (316) having a first main terminal (316-1) AC coupled to the second resonator node (334) and a control terminal (316-3) AC and DC coupled to the first resonator terminal (332). According to a further embodiment there is provided a transmitter (200) including the voltage-controlled oscillator module (300) of claim 19, further comprising an antenna (220) coupled to the voltage-controlled oscillator module (300) and adapted to transmit an electromagnetic signal whose frequency is influenced by the oscillation frequency of the voltage-controlled oscillator module (300).

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A voltage-controlled oscillator module, comprising:
an active-circuit arrangement facilitating generation of an oscillating signal and having first and second principal nodes, and utilizing first and second amplifying elements, each with first and second main terminals and a control terminal, wherein the first principal node is coupled to the first main terminal of the first amplifying element and the second principal node is coupled to the first main terminal of the second amplifying element;
a resonator arrangement having a first resonator node and a second resonator node, wherein the first resonator node is capacitively coupled to the first principal node, the second resonator node is capacitively coupled to the second principal node, and the first and second principal nodes are AC but not DC coupled to the first and second resonator nodes, respectively; and
wherein the control terminal of the first amplifying element is AC and DC coupled to the second resonator node and the control terminal of the second amplifying element is AC and DC coupled to the first resonator node.

2. The voltage-controlled oscillator module of claim 1, wherein the first and second principal nodes are adapted to function as output nodes of the voltage-controlled oscillator module, or wherein the first and second resonator nodes are adapted to function as output nodes of the voltage-controlled oscillator module.

3. The voltage-controlled oscillator module of claim 1, wherein the second main terminals of the first and second amplifying elements are coupled to a common reference terminal.

4. The voltage-controlled oscillator module of claim 3, wherein the second main terminals of the first and second amplifying elements are coupled to the common reference terminal by a frequency dependent impedance.

5. The voltage-controlled oscillator module of claim 3, wherein the second main terminal of the first amplifying element is coupled to the common reference terminal by a further frequency dependent impedance and the second main terminal of the second amplifying element is coupled to the common reference terminal by a still further frequency dependent impedance.

6. The voltage-controlled oscillator module of claim 5, wherein the further frequency dependent impedance and the still further frequency dependent impedance are coupled to a common node which is coupled to the common reference terminal by a still additional frequency dependent impedance.

7. The voltage-controlled oscillator module of claim 5, wherein the further frequency dependent impedance and the still further frequency dependent impedance are parallel combinations of a resistor and a capacitor.

8. The voltage-controlled oscillator module of claim 1, wherein capacitive coupling is provided by capacitive elements that provide DC isolation but are effectively short-circuits at a frequency of the oscillating signal.

9. A voltage-controlled oscillator module, comprising:
an active-circuit arrangement facilitating generation of an oscillating signal and having first and second principal nodes, and utilizing first and second amplifying elements, each with first and second main terminals and a control terminal, wherein the first principal node is coupled to the first main terminal of the first amplifying element and the second principal node is coupled to the first main terminal of the second amplifying element;
a resonator arrangement having a first resonator node and a second resonator node, wherein the first resonator node is capacitively coupled to the first principal node, the second resonator node is capacitively coupled to the second principal node, the control terminal of the first amplifying element is AC and DC coupled to the second resonator node, and the control terminal of the second amplifying element is AC and DC coupled to the first resonator node; and
a further voltage node adapted to receive a third voltage providing power to the active-circuit arrangement, wherein the capacitive elements substantially isolate the resonator arrangement from the further voltage node at frequencies significantly lower than a frequency of the oscillating signal.

10. The voltage-controlled oscillator module of claim 9, wherein the resonator arrangement further comprises a second control voltage terminal coupled to the first and second resonator nodes.

11. The voltage-controlled oscillator module of claim 10, wherein the second control voltage terminal is coupled to the first resonator node by a first inductive element and to the second resonator node by a second inductive element.

12. The voltage-controlled oscillator module of claim 11, wherein the first inductive element and the second inductive element are transmission line segments.

13. A voltage-controlled oscillator, comprising:
a first node adapted to receive a first voltage;
a second node adapted to receive a second voltage;
a third node adapted to receive a third voltage;
a fourth node adapted for receiving a first oscillating signal;
a fifth node adapted for receiving a second oscillating signal;
an active-circuit arrangement adapted to facilitate the first oscillating signal at the fourth node and the second oscillating signal at the fifth node, the active-circuit arrangement being coupled to the first node;
a resonator arrangement coupled to the second node and the third node, the resonator arrangement adapted to substantially determine an oscillation frequency for the first oscillating signal at a first resonator node and adapted to substantially determine an oscillating frequency for the second oscillating signal at a second resonator node, wherein the oscillating signals at the first and second resonator nodes are based on a difference between the voltages at the second and third nodes;
a first capacitive element coupled between the fourth node and the first resonator node;
a second capacitive element coupled between the fifth node and the second resonator node;
a first inductive element coupled between the first node and the fourth node;

a second inductive element coupled between the first node and the fifth node; and wherein the active-circuit arrangement comprises a first amplifying element having a first main terminal thereof coupled to the fourth node and a second amplifying element having a first main terminal thereof coupled to the fifth node, and wherein control terminals of the first and second amplifying elements are cross-coupled, respectively, to the second and first resonator nodes.

14. The voltage-controlled oscillator of claim 13, wherein the first inductive element and the second inductive element are each configured substantially as a quarter wave impedance transformer at the oscillation frequency.

15. The voltage-controlled oscillator of claim 13, further comprising:
 a reference node configured to receive a reference voltage; and
 a third inductive element coupled between the reference node and the active-circuit arrangement.

16. The voltage-controlled oscillator of claim 13, wherein the resonator arrangement includes:
 a first varactor coupled between the second node and the first resonator node;
 a second varactor coupled between the second node and the second resonator node;
 a first inductive element coupled between the third node and the first resonator node; and
 a second inductive element coupled between the third node and the second resonator node.

17. A voltage controlled oscillator (VCO) module adapted to generate an oscillating frequency, comprising:

a resonator arrangement having a first varactor whose first terminal is coupled to a first control voltage node and whose second terminal is coupled at a first resonator node to a first frequency dependent impedance coupled to a second bias voltage node, and having a second varactor whose first terminal is coupled to the first control voltage node and whose second terminal is coupled at a second resonator node to a second frequency dependent impedance coupled to the second bias voltage node, wherein a voltage applied between the first control voltage node and the second bias voltage node determines at least in part the oscillating frequency of the VCO module; and an active circuit arrangement employing first and second amplifying elements, the first amplifying element having a first main terminal AC coupled to and DC isolated from the first resonator node and a control terminal AC and DC coupled to the second resonator node, and the second amplifying element having a first main terminal AC coupled to and DC isolated from the second resonator node and a control terminal AC and DC coupled to the first resonator node.

18. A transmitter including the voltage-controlled oscillator module of claim 17, further comprising an antenna coupled to the voltage-controlled oscillator module and adapted to transmit an electromagnetic signal whose frequency is influenced by the oscillation frequency of the voltage-controlled oscillator module.

* * * * *